(12) United States Patent
Lanzillo et al.

(10) Patent No.: US 11,152,299 B2
(45) Date of Patent: Oct. 19, 2021

(54) HYBRID SELECTIVE DIELECTRIC DEPOSITION FOR ALIGNED VIA INTEGRATION

(71) Applicant: International Business Machines Corporation, Armonk, NY (US)

(72) Inventors: Nicholas Anthony Lanzillo, Wynantskill, NY (US); Christopher J. Penny, Saratoga Springs, NY (US); Hosadurga Shobha, Niskayuna, NY (US); Lawrence A. Clevenger, Saratoga Springs, NY (US); Robert Robison, Rexford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/807,392

(22) Filed: Mar. 3, 2020

(65) Prior Publication Data
US 2021/0280510 A1  Sep. 9, 2021

(51) Int. Cl.
*H01L 23/522* (2006.01)
*H01L 21/768* (2006.01)
*H01L 23/532* (2006.01)

(52) U.S. Cl.
CPC .... *H01L 23/5226* (2013.01); *H01L 21/76897* (2013.01); *H01L 23/5222* (2013.01); *H01L 23/53295* (2013.01)

(58) Field of Classification Search
CPC ............. H01L 23/5226; H01L 23/5222; H01L 23/53295; H01L 21/76897

USPC ......................................................... 257/774
See application file for complete search history.

(56) References Cited

U.S. PATENT DOCUMENTS

| | | | |
|---|---|---|---|
| 6,153,935 A | 11/2000 | Edelstein et al. | |
| 6,358,832 B1 | 3/2002 | Edelstein et al. | |
| 6,514,671 B1 | 2/2003 | Parikh et al. | |
| 6,674,138 B1* | 1/2004 | Halliyal | H01L 21/28185 |
| | | | 257/411 |
| 9,895,715 B2 | 2/2018 | Haukka et al. | |
| 9,953,865 B1 | 4/2018 | Briggs et al. | |
| 10,361,117 B2 | 7/2019 | Penny et al. | |
| 2003/0030099 A1* | 2/2003 | Hsieh | H01L 29/511 |
| | | | 257/315 |
| 2014/0054754 A1* | 2/2014 | Watanabe | H01L 21/76814 |
| | | | 257/635 |

(Continued)

*Primary Examiner* — Tu-Tu V Ho
(74) *Attorney, Agent, or Firm* — Cantor Colburn LLP; Randall Bluestone

(57) ABSTRACT

A technique relates to an integrated circuit. A first dielectric material is formed on a layer, and a second dielectric material is formed on the first dielectric material, the second dielectric material having a different characteristic than the first dielectric material. Conductive material is formed in the first dielectric material, the second dielectric material, and the layer, the conductive material forming interconnects in the layer separated by a stack of the first dielectric material and the second dielectric material. The conductive material forms a self-aligned conductive via on one of the interconnects according to a topography of the stack, the stack of the first dielectric material and the second dielectric material electrically insulating the one of the interconnects from another one of the interconnects.

20 Claims, 10 Drawing Sheets

(56) References Cited

U.S. PATENT DOCUMENTS

2015/0217330 A1    8/2015   Haukka et al.
2019/0013236 A1    1/2019   Licausi et al.
2019/0019726 A1    1/2019   Ryan et al.
2019/0181033 A1*   6/2019   Penny ............... H01L 21/76808

* cited by examiner

FIG. 10 1000

FORM THE INTERCONNECTS OF CONDUCTIVE MATERIAL IN A LAYER  1002

FORM A STACK ON THE LAYER, THE STACK COMPRISING A FIRST DIELECTRIC MATERIAL ON THE LAYER AND A SECOND DIELECTRIC MATERIAL ON THE FIRST DIELECTRIC MATERIAL, THE FIRST DIELECTRIC MATERIAL COMPRISING A DIELECTRIC CONSTANT DIFFERENT FROM THE SECOND DIELECTRIC MATERIAL, THE SECOND DIELECTRIC MATERIAL BEING USED AS AN ETCH STOP, THE STACK SEPARATING ONE OF THE INTERCONNECTS FROM ANOTHER ONE OF THE INTERCONNECTS  1004

HYBRID SELECTIVE DIELECTRIC DEPOSITION FOR ALIGNED VIA INTEGRATION

BACKGROUND

The present invention generally relates to fabrication methods and resulting structures for integrated circuits (ICs), and more specifically, to hybrid selective dielectric deposition for aligned via integration.

ICs (also referred to as a chip or a microchip) include electronic circuits on a wafer. The wafer is a semiconductor material, such as, for example, silicon or other materials. An integrated circuit is formed of a large number devices on the wafer. The back-end-of-line (BEOL) is the second portion of IC fabrication where wiring of the IC is formed. The individual devices, such as transistors, capacitors, resistors, etc. are formed in earlier layers of the IC and interconnected with wiring in the BEOL layers of the wafer. The BEOL layer that includes the interconnection of wiring is referred to as the metallization layer, which generally begins when the first layer of metal is deposited on the wafer. BEOL layers of the IC generally include contacts, insulating layers (dielectrics), metal levels, bonding sites for chip-to-package connections, etc.

SUMMARY

A non-limiting example of a multi-layered integrated circuit (IC) is provided, where at least a region of the IC includes a first dielectric material formed on a layer, and a second dielectric material formed on the first dielectric material, the second dielectric material having a different characteristic than the first dielectric material. Also, the IC includes conductive material formed in the first dielectric material, the second dielectric material, and the layer, the conductive material forming interconnects in the layer separated by a stack of the first dielectric material and the second dielectric material. The conductive material forms a self-aligned conductive via on one of the interconnects according to a topography of the stack, the stack of the first dielectric material and the second dielectric material electrically insulating the one of the interconnects from another one of the interconnects.

A non-limiting example of a method for forming an integrated circuit (IC) includes forming a first dielectric material on a layer and forming a second dielectric material on the first dielectric material, the second dielectric material having a different characteristic than the first dielectric material. Also, the method includes forming conductive material in the first dielectric material, the second dielectric material, and the layer, the conductive material forming interconnects in the layer separated by a stack of the first dielectric material and the second dielectric material.

A non-limiting example of a method for forming interconnects includes forming the interconnects of conductive material in a layer and forming a stack on the layer. The stack includes a first dielectric material on the layer and a second dielectric material on the first dielectric material, the first dielectric material including a dielectric constant different from the second dielectric material, the second dielectric material being used as an etch stop, the stack separating one of the interconnects from another one of the interconnects.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 2-8 depict cross-sectional views of a portion of an IC wafer after fabrication operations for forming the IC wafer shown in FIG. 1 according to one or more embodiments of the invention, in which:

FIG. 2 depicts a cross-sectional view of a portion of the IC wafer after fabrication operations to form conductive vias according to one or more embodiments of the invention;

FIG. 3 depicts a cross-sectional view of the portion of the IC wafer after fabrication operations to form a first dielectric layer according to one or more embodiments of the invention;

FIG. 4 depicts a cross-sectional view of the portion of the IC wafer after fabrication operations to form a second dielectric layer according to one or more embodiments of the invention;

FIG. 5 depicts a cross-sectional view of the portion of the IC wafer after fabrication operations to form a capping layer according to one or more embodiments of the invention;

FIG. 6 depicts a cross-sectional view of the portion of the IC wafer after fabrication operations to form dielectric fill material according to one or more embodiments of the invention;

FIG. 7 depicts a cross-sectional view of the portion of the IC wafer after fabrication operations to form an opening according to one or more embodiments of the invention;

FIG. 8 depicts a cross-sectional view of the portion of the IC wafer after fabrication operations for metallization according to one or more embodiments of the invention;

FIG. 10 is a flow chart of a method for forming interconnects of a portion of an IC wafer according to one or more embodiments of the invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

One or more embodiments of the invention provide an IC wafer with fully-aligned via (FAV) integration using a hybrid selective dielectric deposition process. During the hybrid selective dielectric process, a dielectric material having a low dielectric constant (k) (e.g., low-k) is selectively deposited on another dielectric material having an ultra-low dielectric constant (k) (e.g., ultra-low-k or ULK). A different dielectric material having a high dielectric constant (k) (e.g., high-k) is selectively deposited on the low-k dielectric material, according to one or more embodiments of the invention. Also, the different dielectric material acts as a high-k etch stop layer during etching in preparation for metallization of conductive vias. The high-k etch stop layer protects the minimum insulator thickness during conductive via alignment and even provides protection in the event of misalignment. Particularly, the selective deposition of high-k dielectric material (e.g., acting as a high-k etch stop layer) on top of low-k dielectric material forms a stack that increases the minimum insulator thickness while not negatively impacting capacitance, thereby protecting the maximum applied voltage (Vmax) for the interconnects formed in the ultra-low-k dielectric material.

Figure 1:
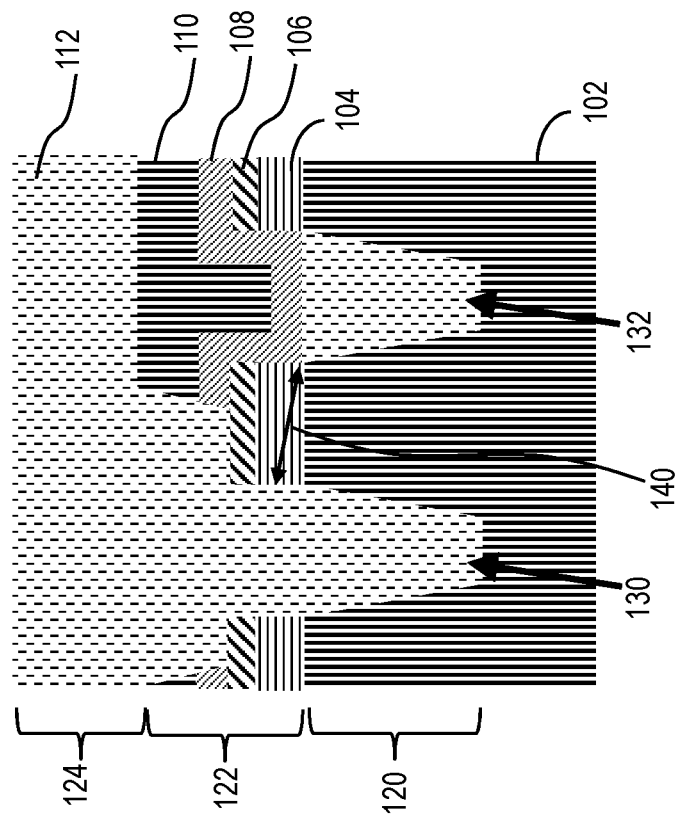
FIG. 1 depicts a cross-sectional view of a portion of an IC wafer fabricated according to one or more embodiments of the invention.

Turning now to a more detailed description of aspects of the present invention, FIG. 1 depicts a cross-sectional view of a portion of an IC wafer 100 after fabrication operations according to one or more embodiments of the invention. The wafer 100 can be part of the back-end-of-line (BEOL) and there can be many other devices already fabricated in the substrate (not shown). FIG. 1 shows interconnects 130 and 132 formed in layer 102. The interconnects 130, 132 can be conductive lines or metal lines that extend in the z-axis, for example, in and out of the page. The interconnects 130, 132 are conductive vias 120 and can be referred to as metal layer (M1) with a general width Mx.

The layer 102 can be an ultra-low-k dielectric material. The dielectric constant (k) of the ultra-low-k dielectric material can be equal to or less than about 2.5 in one or more embodiments of the invention. Also, the dielectric constant (k) of the ultra-low-k dielectric material can be equal to or less than about 2.7 in one or more embodiments of the invention. Further, the dielectric constant (k) of the ultra-low-k dielectric material can be equal to or less than about 3.0 in one or more embodiments of the invention. In some embodiments of the invention, the dielectric constant (k) of the ultra-low-k dielectric material can range from about 2.2-2.7 and/or can range from about 2.2-3.0. Example materials of the ultra-low-k dielectric material can include, but are not limited to, porous SiCN, SiCOH, and Octamethylcyclotetrasiloxane (OMCTS).

In FIG. 1, a first dielectric material 104 is selectively formed on the layer 102 and a second dielectric material 106 is selectively formed on the first dielectric material 104. The first dielectric material 104 can have a dielectric constant (k) greater than the dielectric constant of layer 102 but less than the dielectric constant of the second dielectric material 106. The first dielectric material 104 can be a low-k dielectric material, and the second dielectric material 106 can be a high-k dielectric material having a dielectric constant greater than the first dielectric material 104 so as not to overlap.

In one or more embodiments of the invention, the dielectric constant (k) of the low-k dielectric material of first dielectric material 104 can be equal to or greater than about 3.0, for example, in cases when the dielectric constant of layer 102 is less than 3.0 so as not to overlap. In one or more embodiments of the invention, the dielectric constant of low-k dielectric material for the first dielectric material 104 can range from about 2.0 to 3.0. Examples materials of low-k dielectric material for the first dielectric material 104 can include, but are not limited to, silicon dioxide, porous SiCN, SiCOH, and Octamethylcyclotetrasiloxane (OMCTS).

According to one or more embodiments of the invention, the second dielectric material 106 can be a high-k dielectric material having a dielectric constant greater than the dielectric constant of silicon dioxide (i.e., greater than 3.7-3.9). In one or more embodiments of the invention, the dielectric constant (k) of the high-k dielectric material can be equal to or greater than about 5.0. Examples of high-k dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.).

In FIG. 1, a capping layer 108 is on the first dielectric material 104, second dielectric material 106, and one of the conductive vias 122 which is interconnect 132. A fill material 110 is formed on capping layer 108. Conductive material 112 fills trenches in the IC wafer 100. Conductive via 122 is filled with conductive material 112, and metal layer 124 is formed on conductive via 122. The conductive via 122 physically and electrically connects metal layer 124 to one of the conductive vias 120 which is interconnect 130 but not interconnect 132. The stack of first dielectric material 104 and second dielectric material 106 provides a minimum insulator thickness designated as 140 between interconnect 132 and interconnect 130 and/or conductive via 122. Conductive material 122 can also be referred to as Vx. Metal layer 124 can be referred to as M2 or metal layer 2. The exact location of the arrow designating minimum insulator thickness 140 is not meant to be limited to a specific location. Rather, the minimum insulator thickness 140 is to avoid any conductive material 112 electrically connected to interconnect 130 from electrically (as well as physically) contacting the interconnect 132, thereby avoiding electrical connection between interconnects 130 and 132 directly or indirectly. The minimum insulator thickness 140 could have a range from about 5-20 nm in one or more embodiments of the invention.

Although FIG. 1 depicts two conductive vias 120 as interconnects 130 and 132 and one metal layer 124, it should be appreciated that more metal layers 124 and more conductive vias 120 having more interconnects are contemplated. The conductive material 112 of numerous interconnects can be separated and protected from each other with the minimum insulator thickness 140 as discussed herein.

Figure 2:
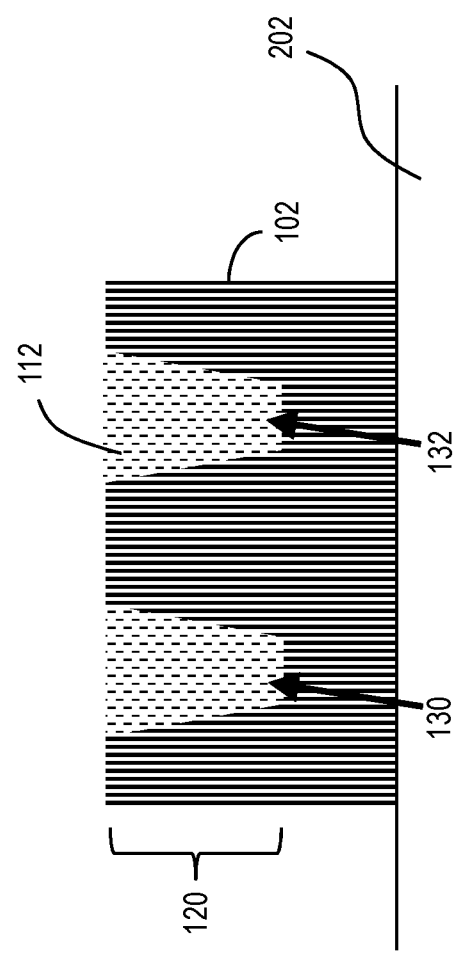

Turning to fabrication operations of forming the IC wafer 100, FIGS. 2-8 illustrate cross-sectional views of forming the IC wafer 100. FIG. 2 depicts a cross-sectional view of the IC wafer 100 according to one or more embodiments of the invention. The IC wafer 100 can be formed using standard lithography processing. Openings are etched into layer 102 and are filled with conductive material 112 to form conductive vias 120 as shown in FIG. 2, thereby resulting in interconnects 130 and 132. Example materials of the conductive material 112 can include, but are not limited to, copper, aluminum, tungsten, tungsten cobalt, ruthenium, nickel, etc. Chemical mechanical polishing/planarization (CMP) can be performed.

The layer 102 can be formed on layer 202. Layer 202 can be a substrate or wafer with one or more devices (not shown) such as transistors, capacitors, resistors, etc., formed thereon as understood by one skilled in the art. Although not shown for conciseness, the interconnects 130 and 132, along with other interconnects, are operatively coupled to the devices as understood by one skilled in the art.

Figure 3:
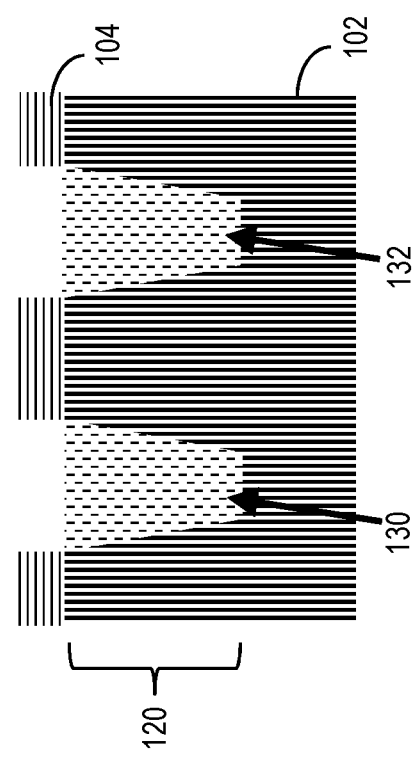

FIG. 3 depicts a cross-sectional view of the IC wafer 100 according to one or more embodiments of the invention. FIG. 3 illustrates selectively depositing the first dielectric material 104 on the layer 102 relative to the conductive material 112 of conductive vias 120. In one or more embodiments of the invention, the layer 102 can be treated to encourage deposition of first dielectric material 104 on the layer 102 relative to the conductive material 112 of conductive vias 120. In one or more embodiments of the invention, conductive material 112 of conductive vias 120 can be treated to prevent deposition of first dielectric material 104. The selective deposition of the first dielectric material 104 on the layer 102 can be by atomic layer deposition (ALD), and/or other techniques can be utilized. The thickness of first dielectric material 104 can range from about 1-4 nanometers (nm). In one or more embodiments of the invention, the thickness of first dielectric material 104 can range from about 1-10 nm. As noted herein, the layer 102 can be an ultra-low-k dielectric material having a dielectric constant (k) less than the dielectric constant of first dielectric material 104.

Figure 4:
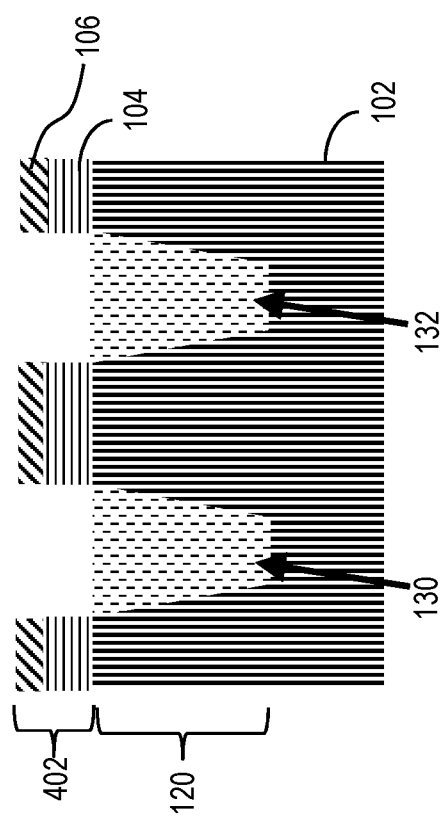

FIG. 4 depicts a cross-sectional view of the IC wafer 100 according to one or more embodiments of the invention. FIG. 4 illustrates selectively depositing the second dielectric material 106 on the first dielectric material 104 relative to the conductive material 112 of conductive vias 120. In one or more embodiments of the invention, the first dielectric material 104 can be treated to encourage deposition of second dielectric material 106 on the first dielectric material 104. In one or more embodiments of the invention, conductive material 112 of conductive vias 120 can be treated to prevent deposition of second dielectric material 106. The selective deposition of the second dielectric material 106 on first dielectric material 104 can be by atomic layer deposition (ALD), and/or other techniques can be utilized. In one or more embodiments of the invention, the first dielectric material 104 and second dielectric material 106 may be equal in thickness. In applications that desired to achieve lower capacitance, the lower-k dielectric material 104 can be thicker than the higher-k dielectric material 106. In other applications it may be desirable to have a thinner first dielectric material 104 and a thicker second dielectric material 106. In some embodiments of the invention, the thickness of the first dielectric material 104 and second dielectric material 106 can each range from about 1-10 nm. In one or more embodiments of the invention, the thickness of second dielectric material 106 can range from about 1-2 nm. In some embodiments of the invention, the thickness of second dielectric material 106 can range from about 1-4 nm.

The first dielectric material 104 and second dielectric material 106 together form a stack 402. In stack 402, the first dielectric material 104 is a low-k dielectric material having a dielectric constant (k) less than the dielectric constant of the second dielectric material 106 which is a high-k dielectric material.

Figure 5:
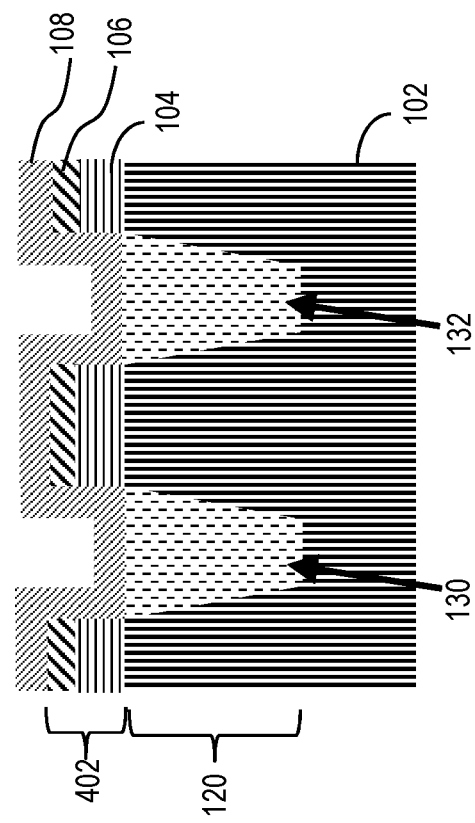

FIG. 5 depicts a cross-sectional view of the IC wafer 100 according to one or more embodiments of the invention. FIG. 5 illustrates conformal deposition of the capping layer 108 on IC wafer 100. In one or more embodiments of the invention, the capping layer 108 can be a dielectric material. Example materials of the capping layer 108 can include silicon, silicon nitride, silicon carbide nitride, silicon boron carbide nitride, etc. In one or more embodiments of the invention, materials of the capping layer 108 can exclude silicon oxides such as silicon dioxide, in cases where the first dielectric material 104 includes silicon dioxide.

Figure 6:
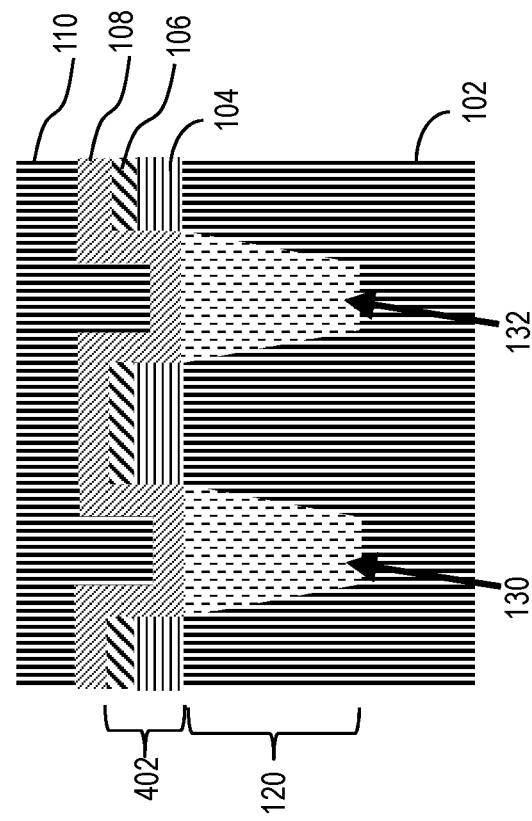

FIG. 6 depicts a cross-sectional view of the IC wafer 100 according to one or more embodiments of the invention. FIG. 6 illustrates conformal deposition of a fill material 110 on capping layer 108. The fill material 110 can be a dielectric material. In one or more embodiments of the invention, examples of fill material 110 can include the dielectric materials used for layer 102. In one or more embodiments of the invention, the fill material 110 can include materials different from layer 102.

Figure 7:
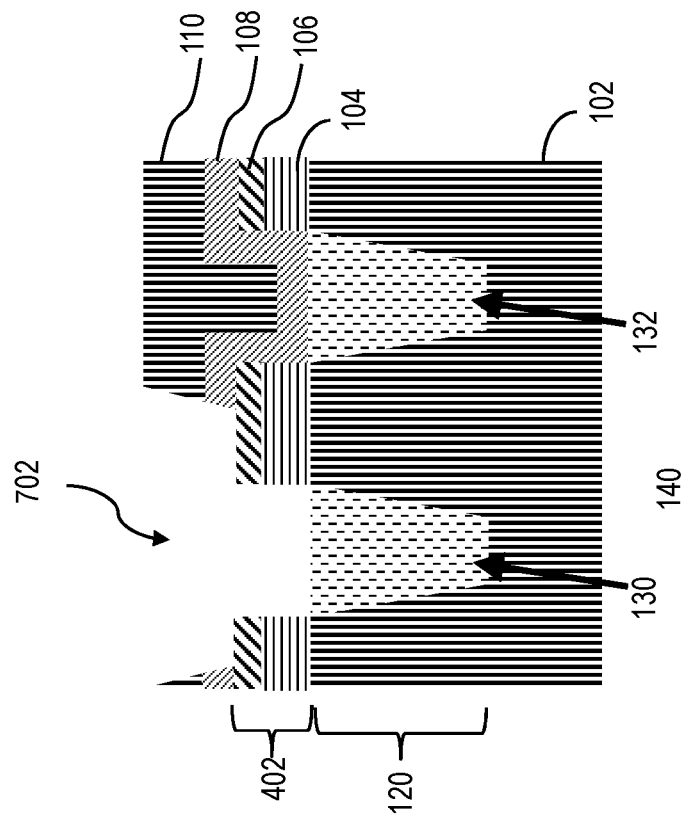

FIG. 7 depicts a cross-sectional view of the IC wafer 100 according to one or more embodiments of the invention. FIG. 7 illustrates that etching is performed to form opening 702. Reactive ion etching can be used to perform the etching. A photoresist material (not shown) or block mask can be patterned, and using the patterned photoresist or block mask as an etch mask, etching can be performed to create opening 702. As can be seen in FIG. 7, etching is through fill material 110 and capping layer 108, while stopping on the second dielectric material 106. As noted herein, the second dielectric material 106 serves as a high-k etch stop layer that protects the first dielectric material 104. By serving as an etch stop layer, the first dielectric material 104 is not etched (vertically or laterally) and prevents any layers underneath, particularly second dielectric material 106, from being etched when forming opening 702. FIG. 7 also shows that opening 702 is a fully-aligned via, which means that opening 702 is fully aligned to interconnect 130 (i.e., conductive via 120) below. The opening 702 exposes interconnect 130 of conductive vias 120 in preparation for metallization.

Figure 8:
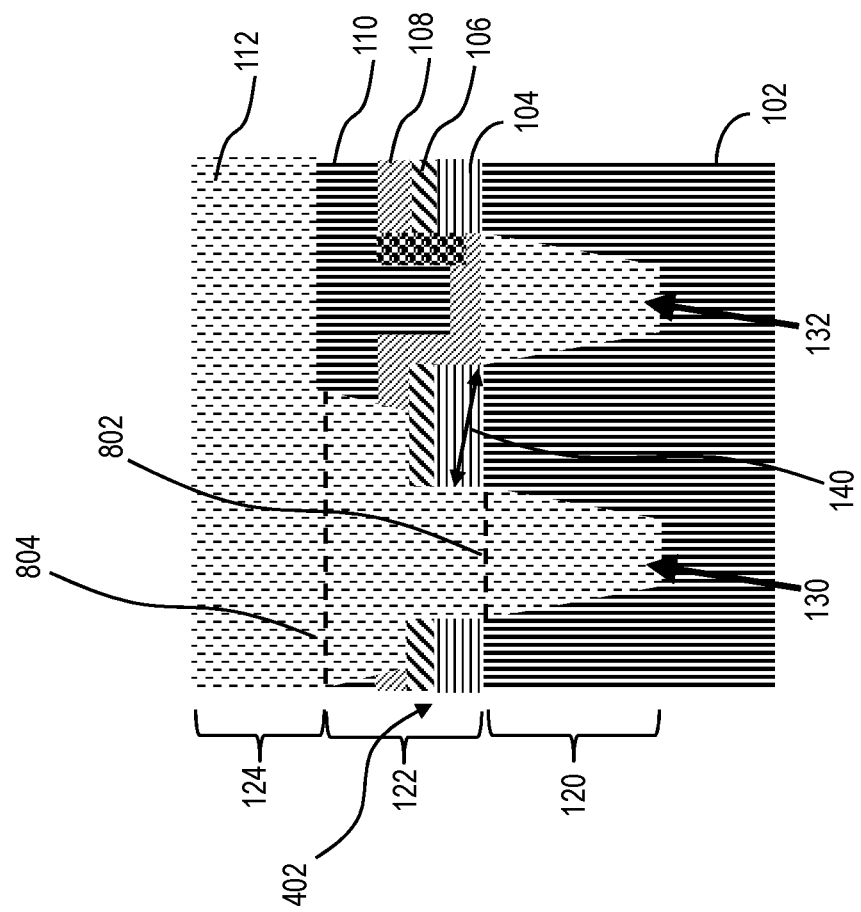

FIG. 8 depicts a cross-sectional view of the IC wafer 100 according to one or more embodiments of the invention. FIG. 8 illustrates metallization in which conductive material 112 is deposited. Accordingly, conductive via 122 and metal layer 124 are formed. Although added for explanation purposes and not necessarily present in actuality, dashed line 802 is shown to delineate the conductive via 120 (e.g., interconnect 130, Mx, or M1) from conductive via 122 (e.g., Vx), and dashed line 804 is shown to delineate conductive via 122 from metal layer 124 (e.g., M2 or M(x+1)).

By using stack 402, one or more embodiments of the invention increase the minimum insulator thickness 140 between interconnect 132 and any other conductive material 112 of interconnect 130 and/or conductive via 122 (e.g., Vx). It should be appreciated that conductive material 112 of interconnect 130 and conductive via 122 has the same electrical potential (i.e., voltage). By increasing the minimum insulator thickness 140, a higher voltage maximum (Vmax) can be applied to and accommodated by each neighboring interconnect 130 (eclectically connected to conductive via 122) and 132 without one interconnect negatively impacting the other. In accordance with one or more embodiments of the invention, the fully-aligned conductive via 122 preserves and/or increases minimum insulator thickness 140, while avoiding an increase and/or avoiding an appreciable increase in capacitance. Further, second dielectric material 106 (e.g., top-most high-k dielectric material) in stack 402 acts as an etch stop in the event of conductive via (122) misalignment. The first dielectric material 104 (e.g., bottom-most low-k dielectric material) reduces the line-to-line capacitance of interconnects by screening the interconnect trenches (e.g., conductive vias 120) from the higher-k dielectric material above. This process can be applied to numerous neighboring interconnects in an integrated circuit.

Figure 9:
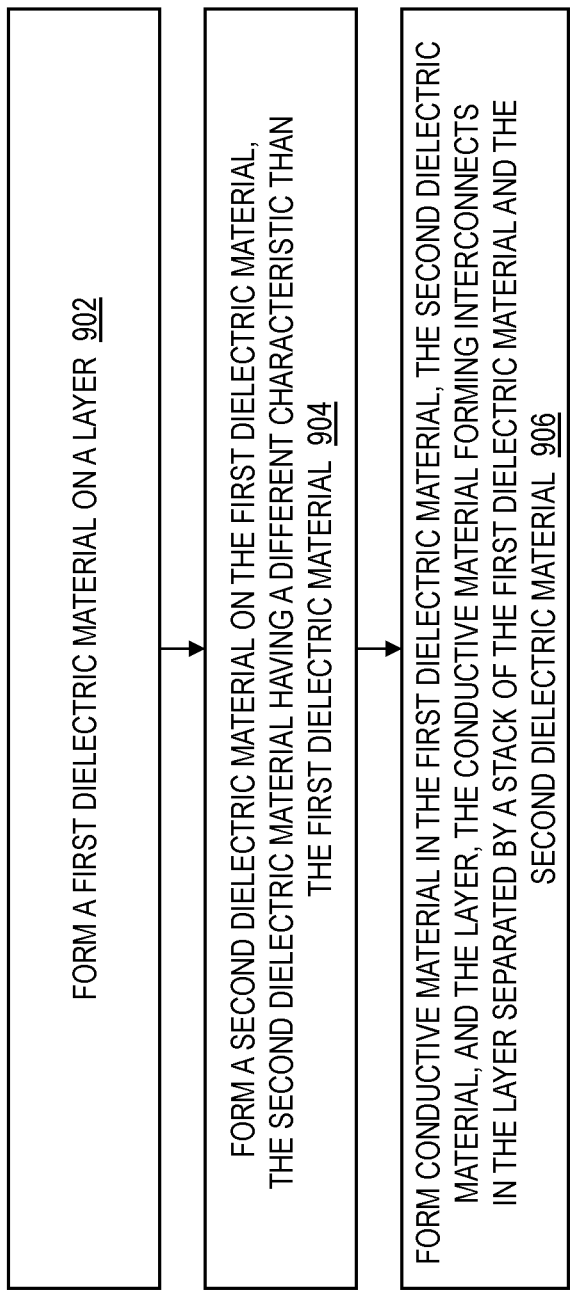
FIG. 9 is a flow chart of a method for forming a portion of an IC wafer according to one or more embodiments of the invention.

FIG. 9 is a flowchart of a method 900 of forming a IC wafer 100 according to one or more embodiments of the invention. At block 902, the method 900 includes forming a first dielectric material 104 on a layer 102, and forming a second dielectric material 106 on the first dielectric material 104, the second dielectric material having a different characteristic than the first dielectric material at block 904. At block 906, the method 900 includes forming conductive material 112 in the first dielectric material 104, the second dielectric material 106, and the layer 102, the conductive material 112 forming interconnects 130 and 132 in the layer 102 separated by a stack 402 of the first dielectric material and the second dielectric material.

Further, the first dielectric material and the second dielectric material include different dielectric constants (k), the second dielectric material being used as an etch stop. A self-aligned conductive via (e.g., conductive via 122) is formed on one of the interconnects (e.g., interconnect 130), the self-aligned conductive via being aligned to the one of the interconnects according to a topography of the stack 402. The second dielectric material includes a dielectric constant greater than the first dielectric material. The layer 102 includes a dielectric material. The first dielectric material 104 has a dielectric constant greater than the layer 102. The stack 402 of the first dielectric material and the second dielectric material electrically insulates neighboring ones of the interconnects 130 and 132. The stack 402 of the first dielectric material and the second dielectric material is configured to prevent leakage of electrical current between neighboring ones of the interconnects. The interconnects 130 and 132 formed in the layer are metal lines. A capping material (e.g., capping layer 108) is formed on a portion of at least one of the interconnects, portions of the first dielectric material, and portions of the second dielectric material.

FIG. 10 is a flowchart of a method 1000 of forming interconnects for a IC wafer 100 according to one or more embodiments of the invention. At block 1002, the method 1000 includes forming the interconnects 130 and 132 of conductive material 112 in a layer 102. At block 1004, the method 1000 includes forming a stack 402 on the layer 102, the stack including a first dielectric material 104 on the layer and a second dielectric material 106 on the first dielectric material 104. The first dielectric material 104 includes a dielectric constant different from the second dielectric material 106, the second dielectric material being used as an etch stop, the stack separating one (e.g., interconnect 130) of the interconnects from another one (e.g., interconnect 132) of the interconnects.

Further, a self-aligned conductive via (e.g., conductive via 122) is formed on the one of the interconnects (e.g., interconnect 122), the self-aligned conductive via being aligned to the one of the interconnects according to a topography of the stack 402, the stack 402 separating the self-aligned conductive via (e.g., conductive via 122) from the another one of the interconnects (e.g., interconnect 132).

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A multi-layered integrated circuit (IC), wherein at least a region of the IC comprises:

a first dielectric material formed on a layer;

a second dielectric material formed on the first dielectric material, the second dielectric material having a different characteristic than the first dielectric material; and conductive material formed in the first dielectric material, the second dielectric material, and the layer, the conductive material forming interconnects in the layer separated by a stack of the first dielectric material and the second dielectric material, the conductive material forming a self-aligned conductive via on one of the interconnects according to a topography of the stack, the stack of the first dielectric material and the second dielectric material electrically insulating the one of the interconnects from another one of the interconnects, a side surface of the first dielectric material being in direct contact with the self-aligned conductive via on the one of the interconnects.

2. The IC of claim 1, wherein the first dielectric material and the second dielectric material comprise different dielectric constants.

3. The IC of claim 1, wherein the second dielectric material comprises a dielectric constant greater than the first dielectric material.

4. The IC of claim 1, wherein the layer comprises a dielectric material.

5. The IC of claim 1, wherein the first dielectric material comprises a dielectric constant greater than the layer.

6. The IC of claim 1, wherein a portion of the self-aligned conductive via is formed at least partly on a top surface of the second dielectric material by having the second dielectric material formed as an etch stop.

7. The IC of claim 1, wherein the stack of the first dielectric material and the second dielectric material is configured to prevent leakage of electrical current between neighboring ones of the interconnects.

8. The IC of claim 1, wherein the interconnects formed in the layer are metal lines.

9. The IC of claim 1, wherein a capping material is formed on a portion of at least one of the interconnects, portions of the first dielectric material, and portions of the second dielectric material.

10. A method of forming an IC, the method comprising:
forming a first dielectric material on a layer;
forming a second dielectric material on the first dielectric material, the second dielectric material having a different characteristic than the first dielectric material; and
forming conductive material in the first dielectric material, the second dielectric material, and the layer, the conductive material forming interconnects in the layer separated by a stack of the first dielectric material and the second dielectric material, a side surface of the first dielectric material being in direct contact with the conductive material on one of the interconnects.

11. The method of claim 10, wherein the first dielectric material and the second dielectric material comprise different dielectric constants, the second dielectric material being used as an etch stop.

12. The method of claim 10 further comprising forming a self-aligned conductive via on the one of the interconnects, the self-aligned conductive via being aligned to the one of the interconnects according to a topography of the stack, wherein the second dielectric material comprises a dielectric constant greater than the first dielectric material.

13. The method of claim 10, wherein the layer comprises a dielectric material.

14. The method of claim 10, wherein the first dielectric material comprises a dielectric constant greater than the layer.

15. The method of claim 10, wherein the stack of the first dielectric material and the second dielectric material electrically insulates neighboring ones of the interconnects.

16. The method of claim 10, wherein the stack of the first dielectric material and the second dielectric material is configured to prevent leakage of electrical current between neighboring ones of the interconnects.

17. The method of claim 10, wherein the interconnects formed in the layer are metal lines.

18. The method of claim 10, wherein a capping material is formed on a portion of at least one of the interconnects, portions of the first dielectric material, and portions of the second dielectric material.

19. A method of forming interconnects, the method comprising:
forming the interconnects of conductive material in a layer; and
forming a stack on the layer, the stack comprising a first dielectric material on the layer and a second dielectric material on the first dielectric material, the first dielectric material comprising a dielectric constant different from the second dielectric material, the second dielectric material being used as an etch stop, the stack separating one of the interconnects from another one of the interconnects, a side surface of the first dielectric material being in direct contact with the conductive material on one of the interconnects.

20. The method of claim 19 further comprising forming a self-aligned conductive via on the one of the interconnects, the self-aligned conductive via being aligned to the one of the interconnects according to a topography of the stack, the stack separating the self-aligned conductive via from the another one of the interconnects.

* * * * *